United States Patent

Reece et al.

Patent Number: 6,007,908
Date of Patent: Dec. 28, 1999

[54] COATINGS

[75] Inventors: David M Reece, Northampton; Paul V Dennis, Nr. Daventry, both of United Kingdom

[73] Assignee: GEC. Marconi Limited, United Kingdom

[21] Appl. No.: 08/798,861

[22] Filed: Feb. 11, 1997

[30] Foreign Application Priority Data

Feb. 13, 1996 [GB] United Kingdom ............. 9602942

[51] Int. Cl.⁶ .................................. C23C 16/30
[52] U.S. Cl. .................... 428/334; 428/432; 428/698; 359/359
[58] Field of Search .............................. 428/698, 432, 428/212, 334; 359/359

[56] References Cited

U.S. PATENT DOCUMENTS

| | | | |
|---|---|---|---|
| 4,450,201 | 5/1984 | Brill et al. | 428/336 |
| 5,336,565 | 8/1994 | Muromachi et al. | 428/698 |
| 5,411,794 | 5/1995 | Kawaguchi et al. | 428/432 |
| 5,493,442 | 2/1996 | Buchholz et al. | 428/426 |
| 5,728,456 | 3/1998 | Adair et al. | 428/432 |

*Primary Examiner*—Archene Turner
*Attorney, Agent, or Firm*—Kirschstein, et al

[57] ABSTRACT

A scratch resistant coating for the window of an infra red sensor comprises a layer of zirconium oxynitride or hafnium oxynitride. The formula of the coating is $M_{1-(y+z)}O_yN_z$ where y and z are both in the range 0.1 to 0.4. The coating and the window are both transmissive in the infra red and visible ranges of the spectrum.

8 Claims, 2 Drawing Sheets

COATINGS

BACKGROUND OF THE INVENTION

This invention relates to coatings for infra-red transparent materials and applies particularly, but not exclusively, to coatings for multispectral window materials.

Infra-red (IR) radiation means radiation which is in the wavelength range in the region of approximately 1 $\mu$m to approximately 14 $\mu$m This includes a first IR radiation range of 3 $\mu$m to 5 $\mu$m and a second IR radiation range of 8 to 14 $\mu$m. Radiation in the range 5 $\mu$m to 8 $\mu$m is largely absorbed by the atmosphere. Measured IR radiation can be used to determine a value of temperature of a body or to observe objects particularly when visible light levels are low.

IR detectors are usually relatively fragile and need to be protested from their environment, for example atmospheric conditions and physical contact. Therefore they are placed behind windows or domes which are made of materials transparent to the radiation that is being detected. Since many IR window materials are inherently soft and have poor scratch reistance, they suffer from erosion. Airborne systems suffer from rain, sand and insect damage inflicted at high velocities. In land based systems a combination of sand and window wipers can cause scratches.

It is known to protect IR windows by coating them with a hard protective coating. Known protective coatings for IR windows include diamond-like carbon (which is disclosed in British Patent GB 2082562 B) and boron phosphide (which is disclosed in British Patent GB 2223510 B).

However, a disadvantage of the use of such coatings is that they do not transmit radiation at visible wavelengths. The term visible refers to wavelengths approximately between 300 nm and 1000 nm (1 $\mu$m). Since sensor systems may comprise detectors to detect visible radiation in addition to IR and it is convenient to locate both kinds of detector behind the same window, a hard multi-wavelength coating material is needed.

SUMMARY OF THE INVENTION

According to a first aspect the invention provides a coating material for a window the coating material comprising metal oxynitride and being substantially transmissive to visible radiation and to IR radiation.

It is to be understood that the term transmissive means capable of transmitting a useful amount of incident radiation. Preferably the transmissivity of a coating of the coating material is 50% for a coating which is about 100 $\mu$m thick, more preferably about 50 $\mu$m thick and most preferably about 10 $\mu$m thick. Preferably the metal oxynitride transmits substantially across the range 1 $\mu$m to 14 $\mu$m. Most preferably the metal oxynitride transmits in the range 8 $\mu$m to 14 $\mu$m.

The window may be a window for a sensor. The term sensor refers to one or more electronic devices for detecting or emitting electromagnetic radiation in the ranges of IR, visible or both.

The chemical formula of the coating material is $M_{1-(y+z)}O_yN_x$ where M represents a metal element or combination of metals and with y and z having values which vary depending upon the desired properties of the coating material. Preferably y is in the range 0.1 to 0.4. Preferably z is in the range 0.1 to 0.4. The values of y and z can vary depending on the metal or combination of metals used. For example, for zirconium y is approximately 0.35 and z is approximately 0.20, whereas for hafnium, y is approximately 0.17 and z is approximately 0.33.

Preferably the metal is one or more metals from the transition and landslide metal series. Most preferably it is zirconium or hafnium or a combination of both.

The window may comprise any of the following materials: zinc sulphide, zinc selenide, germanium, silicon, quartz or sapphire. Alternatively the window may be comprised substantially wholly of the metal oxynitride, such that the metal oxynitride is self supporting.

Preferably the coating is of a thickness between 5 $\mu$m and 15 $\mu$m although coatings of greater thickness, up to 50 $\mu$m may be manufactured.

The metal oxynitdide maerial may be formed by ion beam sputtering. Preferably dual ion beam sputtering is used. Most preferably reactive dual ion beam sputtering is used. Preferably the sputtering target comprises metallic zirconium, hafnium or both. Alternatively compounds of zirconium or hafnium may be used as the target.

The metal oxynitride may coat one or on both sides of the window.

The metal oxynitride may be the outermost coating on the window, that is the coating exposed to the atmosphere. Alternatively the metal oxynitride may comprise a bonding layer between the window and another coating, such as a hard outer coating or an anti-reflection coating. Such a bonding layer may be between 0.01 $\mu$m and 1.0 $\mu$m thick although in some applications it may be thicker, for example, of the order of 20 $\mu$m. The metal oxynitride coating may comprise a protective interlayer for protecting the window material from further coatings to be applied to the window. An interlayer may also provide stress relief between coatings adjacent to it.

Advantageously one or more metal oxynitride coatings comprise both bonding layers and protective interlayer layers.

According to a second aspect the invention provides a method of producing a coating of metal oxynitide on a sensor window comprising the steps of:

providing a sputtering target containing the metal in a vacuum chamber;

sputtering the target with a primary ion gun;

bombarding the substrate with ions of oxygen, nitrogen or both from a secondary ion gun; and depositing a coating of metal oxynitride on the substrate.

The invention may also provide a metal oxynitide coating made in accordance with the second aspect of the invention.

Preferably the substrate is maintained at a temperature in the range 100 to 500° C., most preferably in the range 300 to 400° C. The target may comprise metallic hafnium, zirconium, or a combination of these metals such as an alloy. Alternatively the target may comprise hafnium nitride, zirconium nitride, hafnium oxide or zirconium oxide.

The metal oxynitride may be of the formula $M_{1-(y+z)}O_yN_z$. The final composition of the coating material, that is the values of y and z, may be controlled by controlling the amount of oxygen, nitrogen or both which is fed to the secondary gun or by the composition of the target material which may be a nitride, oxide or oxynitride of the oxynitride coating material to be formed.

According to a third aspect the invention provides a window coated with a coating in accordance with the first or second aspects of the invention.

According to a fourth aspect the invention provides a radiation source and/or detector system comprising a window in accordance with the third aspect of the invention.

Preferably the system comprises one or more devices for detecting electromagnetic radiation in the ranges of IR, visible or both. Preferably the system comprises one or more sources of electromagnetic radiation in the ranges of IR, visible or both. The sensor system may comprise devices which are radiation sources such as lasers.

BRIEF DESCRIPTION OF THE DRAWINGS

An embodirriezit of the invention will now be described, by way of example only, with reference to the accompanying drawings in which.

DETAILED DESCRIPTION OF THE PREFERRED EMBODIMENT

Figure 1:
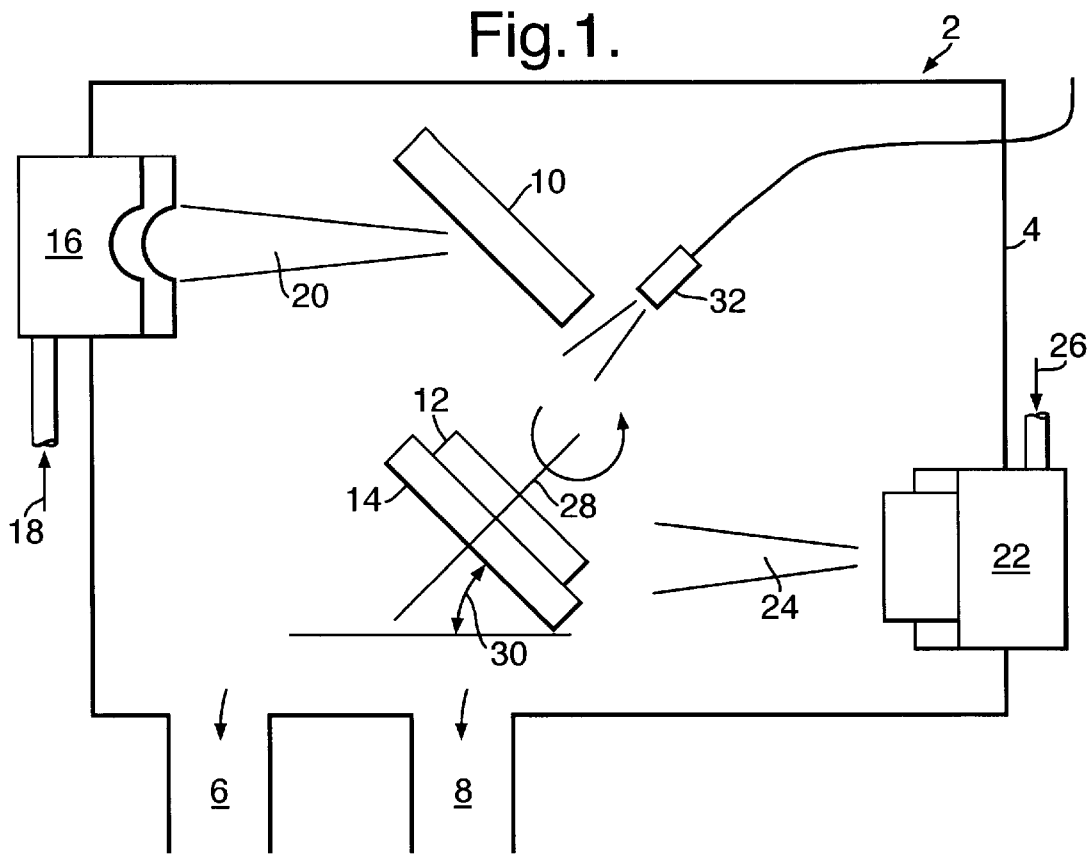
FIG. 1 shows a sputtering system.

FIG. 1 shows a sputtering system 2 known in the art as a dual ion beam system (DBS). The system 2 comprises a vacuum chamber 4 which is evacuated by a turbomolecular pump (outlet 6) and a cryopump (outlet 8). A target 10 is located in the vacuum chamber 4 together with a substrate 12 which is supported on a substrate holder 14. The target 10 is angled towards the substrate.

The target is comprised of zirconium or hafnium metal although nitrides or oxides of these metals may be used.

Two ion beam guns operating at radio frequency are in the vacuum chamber. A primary ion beam gun 16 which is fed by a supply 18 of inert gas, for example argon or krypton, produces a focussed primary ion beam 20 which is directed towards the target 10. A secondary ion beam gun 22 produces a diffuse secondary ion beam 24 which is directed towards the substrate 12. The secondary ion beam gun 22 is fed by a gaseous supply 26 of oxygen and nitrogen.

The substrate holder 14 is rotatable about an axis 28 in order to control the uniformity of deposition of material on the substrate. The substrate holder is also tiltable through an arc 30 of 0 to 45° for controlling the composition of the materials deposited. The substrate holder also comprises heating means (not shown) to heat the substrate to a temperature suitable for deposition. A two color IR pyrometer 32 is used to measure the temperature of the substrate.

In operation the primary ion beam gun 16 is supplied with krypton gas which is ionized and fired at the target 10 as a focussed beam. Impact of krypton ions on the target sputters target material out of the target. Sputtered target material which lands on the substrate forms a coat on the substrate, The substrate may be rotated during sputtering. The temperature of the substrate is controlled by heating means. During coating the substrate is held at a temperature of about 350° C.

As target material is being sputtered onto the substrate the secondary ion beam gun 22 directs ions towards the substrate. Oxygen and nitrogen ions are used to bombard the substrate if a metallic target is used. For example if a target of zirconium metal is used, oxygen and nitrogen ions are filed from the gun 22 simultaneously or alternately in order to form zirconium oxynitride. If the target were to be zirconium nitride an oxygen ion beam with little or no nitrogen ion content would be used. The converse would apply if a zirconium oxide target was used. Therefore a coating of zirconiumn oxynitride can be built up on the substrate. A target comprising hafnium could be used to manufacture a coating of hafnium oxynitdide.

An example of a fabrication method to make a zirconium oxynitride coating using a Nordiko 3450 dual ion bean sputtering system set to the following parameters:

| Parameter | zirconium oxynitride |
|---|---|
| Pan angle | 73% |
| Chamber pressure | $1.3 \times 10^{-4}$ torr |
| Deposition temperature | 330–350° C. |
| Gun 1 Kryptan flow | 20 sccm |
| Gun 1 Voltage | 700 V |
| Gun 1 Current | 90 mA |
| Gun 2 Nitrogen flow | 35 sccm |
| Gun 2 Oxygen flow | 5 sccm |
| Gun 2 Voltage | 100 V |
| Gun 2 Current | 40 mA |

A hafnium oxynitride coating may be made using the same parameters if an appropriate target material is used, for example a hafnium metal target.

Prior to deposition of the coating the substrate may be cleaned by using an inert gas ion beam from the secondary ion gun.

Using this method metal oxynitxide coatings having been deposited on such substrate materials as germanium, zinc sulphide, silicon and fused quartz. The coatings are in the region of 10 $\mu$m thick. Using the metal oxynitride coatings is desirable because they are hard and scratch resistant. However, unlike coatings which have been known hitherto these metal oxynitride coatings have good transmission properties across both visible and IR wavelengths.

Figure 2:
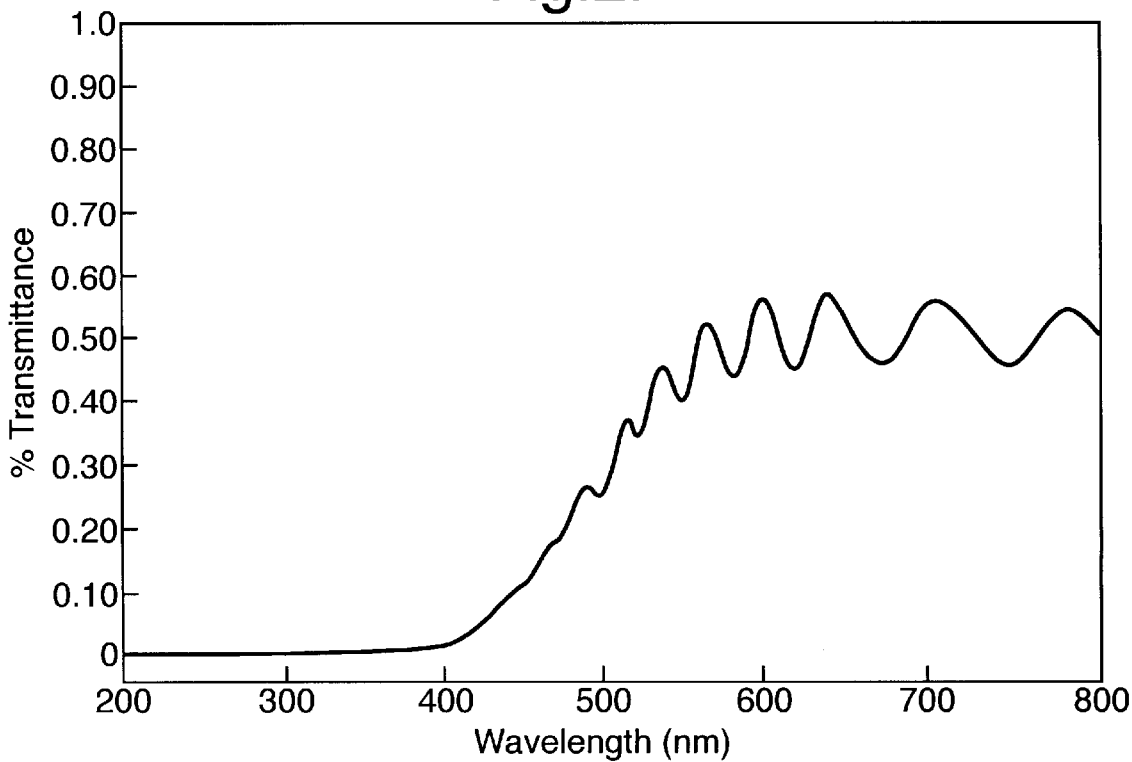
FIG. 2 shows a graph of transmission of a coated IR window material across visible wavelengths.

The transmission in the visible part of the spectrum through a 1.5 $\mu$m thick zirconium oxynitride film deposited on a fused silicon substrate is shown in FIG. 2. As shown in the graph the transmission is around 50% in the visible region. Some of the incident light which is not transmitted is due to reflection from the coating surface and the coating/substrate interface. It is anticipated that transmission values of up to 99% may be obtained should the zirconium oxynitride coating be coated with an anti-reflection coating.

Figure 3:
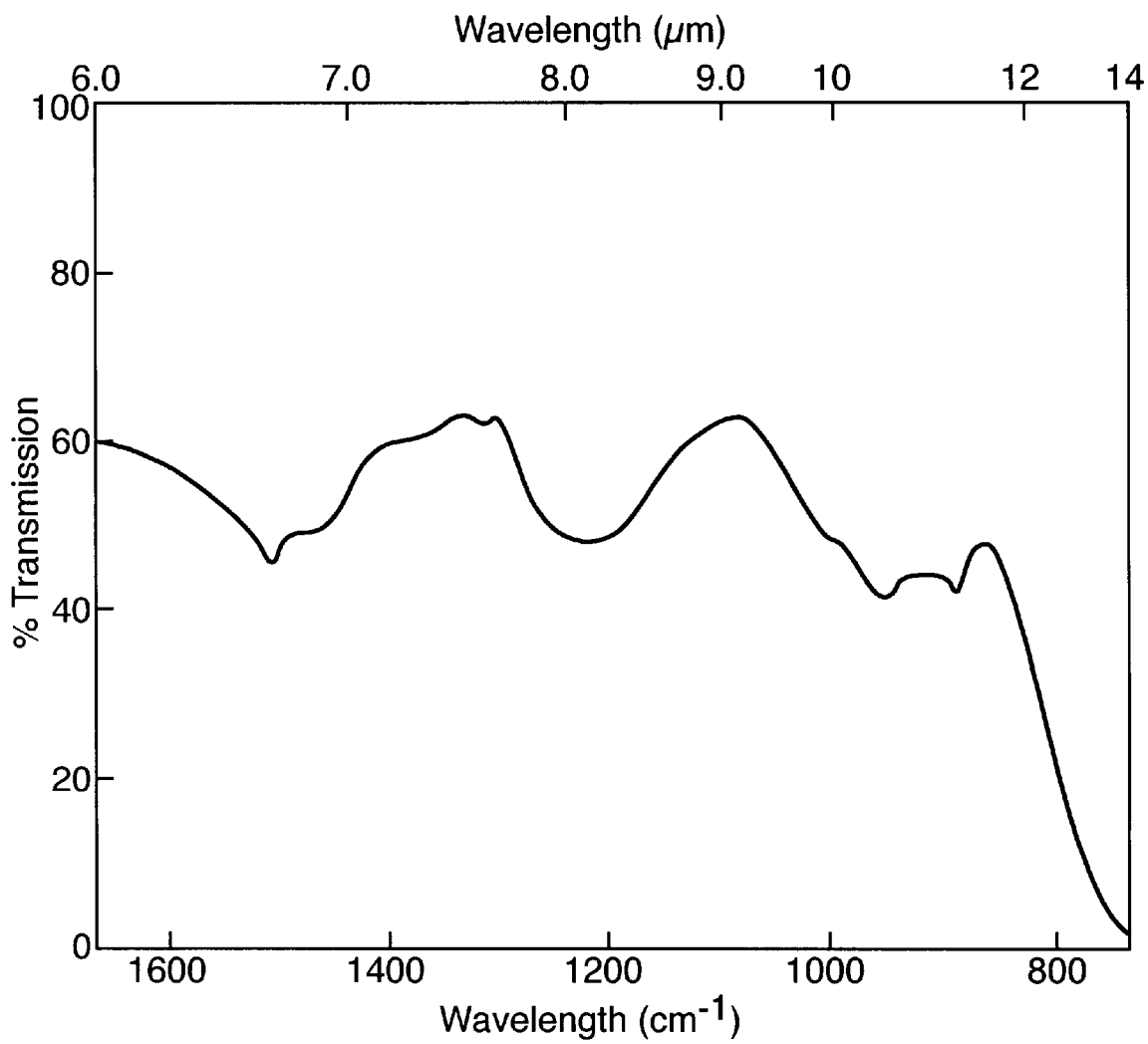
FIG. 3 shows a graph of transmission of a coated IR window material across infra-red wavelengths.

The transmission in the IR part of the spectrum between 8 $\mu$m and 12 $\mu$m through a 7 $\mu$m thick zirconium oxynitride film deposited on a germanium substrate is shown in FIG. 3. As shown in the graph the transmission is around 50% in the infra red region. Again much higher transmission values are anticipated should anti-reflection coatings be used.

In order to achieve adequate adhesion of a metal oxynitride coating to some substrates a thin bonding layer may be used as a layer between the substrate and the coating. The bonding layer may be deposited on the substrate by the dual ion beam method or some other suitable method prior to deposition of the metal oxynitride coating using appropriate materials and coating techniques. The bonding layer may comprise one or more of the following: germanium, germanium nitride, silicon, hafnium or zirconium oxide or nitride. However any layer which will bond to the window and to an outer coating and when sufficiently thin will transmit visible and infra red radiation may be used The layer would be approximately 0.1 $\mu$m thick. Alternatively a layer of zirconium oxynitride or hafnium oxynitride may itself form a bonding layer on which another coating, for example an anti-reflection coating, is deposited.

In some applications IR windows may be coated with a diamond coating. This provides high erosion and impact resistance due to the exceptional hardness of diamond. Furthermore, since diamond can transmit radiation in both visible and infra red wavelengths it has excellent transmission properties for use as a coating in this type of application.

A suitable method of applying a diamond coating is plasma enhanced chemical vapour deposition. However, due to the nature of the gases involved, (predorminantly methane and hydrogen) the plasma is aggressive and chemically attacks many window materials including zinc sulphide and zinc selenide. This chemical attack etches the surface of a zinc sulphide window and forms hydrogen sulphide. In order to protect the surface of the window material from attack a protective layer, called an interlayer, is employed. This interlayer may also promote diamond adhesion and provide stress relief. Deposition of a diamond layer occurs at high temperatures (between 500° C. and 900° C.), and during cooling of the coated window interface stresses between the diamond coating and window develop due to the large thermal expansion mismatch between the diamond coating and the IR window. An interlayer can be used to grade the stress to avoid interface failure and coating delamination. Metal oxynitmides such as zirconium oxynitride and hafnium oxynitride provide suitable interlayers for diamond deposition.

Figure 4:
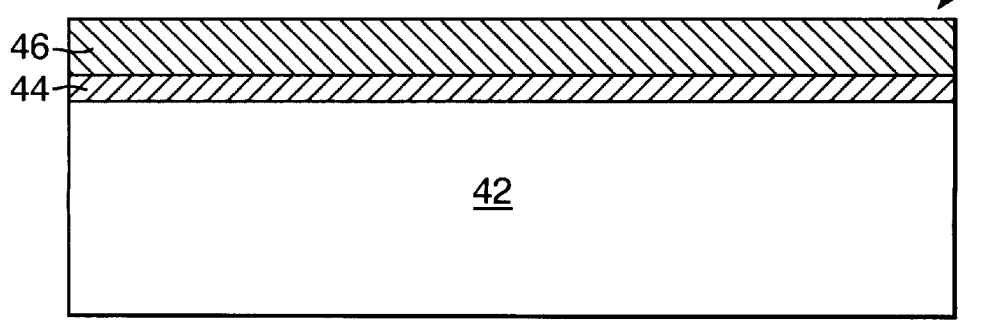
FIG. 4 shows a schematic representation of a coated IR window.

FIG. 4 shows a representation of a coated window 40. The coated window 40 comprises a substrate 42 supporting a metal oxynitride layer 44 which in turn is coated with a diamond coating 46. In this embodiment the metal oxynitride layer is serving as a coating, a bonding layer and as an interlayer.

In commercial use it is anticipated that the coated window will also comprise an anti-reflection coating. This may be applied to the diamond coating 46 or directly to a metal oxynitride coating should the diamond coating not be present.

Metal oxynitxide coatings provide hard and scratch resistant coatings for IR windows having a broad transmission range across IR and visible wavelengths. Additionally they can be used as bonding layer to support harder coatings or anti-reflection coatings as well as protective interlayers.

We claim:

1. A coating material for a transparent window, the coating material comprising: a dual ion beam sputtered layer of a metal oxynitride having a thickness in a range of 10 $\mu$m to 100 $\mu$m, the metal oxynitride having a chemical formula of $M_{1-(y+z)}O_yN_z$, where M represents a metal, where O represents oxygen, where N represents nitrogen, and where y and z each have values in a range from 0.1 to 0.4, the layer having a light transmissivity characteristic of at least 50% to visible light in a visible light range of wavelengths from 300 nm to 1 $\mu$m and to infrared light in a far infrared range of wavelengths from 6 $\mu$m to 12 $\mu$m.

2. The coating material according to claim 1, wherein the metal is a metal element selected from the transition metal series.

3. The coating material according to claim 1, wherein the metal is a metal element selected from the lanthanide metal series.

4. The coating material according to claim 1, wherein the metal is a combination of metal elements.

5. The coating material according to claim 1, wherein the metal is zirconium, and wherein y is on the order of 0.35, and wherein z is on the order of 0.20.

6. The coating material according to claim 1, wherein the metal is hafnium, and wherein y is on the order of 0.17, and wherein z is on the order of 0.33.

7. The coating material according to claim 1, wherein the thickness is in a range from 5 $\mu$m to 15 $\mu$m.

8. The coating material according to claim 1, wherein the layer is a hard, scratch-resistant coating to protect the window from environmental conditions.

* * * * *